United States Patent
Grab et al.

(10) Patent No.: US 6,287,682 B1
(45) Date of Patent: *Sep. 11, 2001

(54) DIAMOND COATED TOOLS AND PROCESS FOR MAKING

(75) Inventors: George P. Grab, Greensburg; William M. Melago, Latrobe; Edward J. Oles, Ligonier, all of PA (US); Gerald D. Murray, Raleigh, NC (US); Charles Erik Bauer, Greensburg; Aharon Inspektor, Pittsburgh, both of PA (US)

(73) Assignee: Kennametal PC Inc., Monrovia, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/767,263

(22) Filed: Dec. 13, 1996

Related U.S. Application Data

(63) Continuation of application No. 08/159,272, filed on Nov. 30, 1993, now Pat. No. 5,585,176.

(51) Int. Cl.$^7$ .................................................. C30B 29/04

(52) U.S. Cl. .................. 428/336; 428/212; 428/156; 428/172; 428/408; 428/472; 428/697; 428/698; 428/699; 407/119; 51/295; 51/307; 51/309

(58) Field of Search ................................ 428/336, 212, 428/172, 408, 472, 697, 698, 699, 156; 407/119; 51/295, 307, 309

(56) References Cited

U.S. PATENT DOCUMENTS

| | | | |
|---|---|---|---|
| Re. 34,180 | 2/1993 | Nemeth et al. | 428/547 |
| 4,282,289 | 8/1981 | Kullander et al. | 428/457 |
| 4,374,685 | 2/1983 | Suzuki et al. | 148/126 |
| 4,636,252 | 1/1987 | Yoshimura et al. | 75/238 |
| 4,643,620 | 2/1987 | Fujii et al. | 407/119 |
| 4,690,691 | 9/1987 | Komanduri | 81/293 |
| 4,731,296 | * 3/1988 | Kikuchi et al. | 428/408 |

(List continued on next page.)

FOREIGN PATENT DOCUMENTS

| | | |
|---|---|---|
| 10519587 | 12/1992 | (EP) . |
| 64-4586 | 1/1985 | (JP) . |

(List continued on next page.)

OTHER PUBLICATIONS

Katsumura et al., "The Effects of Cobalt Content and Surface State of Substrate on Cutting Performance of Diamond Deposited Cemented Carbide Tool for Al–18% Si–Alloy," Journal of Japan Institute of Light Metals, vol. 39, No. 9, pp. 634–638 (1989)(Trans. and Orig. Japanese). (No Month).

(List continued on next page.)

*Primary Examiner*—Archene Turner
(74) *Attorney, Agent, or Firm*—John J. Prizzi

(57) ABSTRACT

A process for making a diamond-coated tool and the tool made thereby. The process includes a sintering step. In that step, the tool substrate is sintered in an atmosphere and for a time and at a temperature so that superficial, exaggerated grain growth is promoted that imparts a surface roughness which may serve as anchoring sites during a subsequent diamond coating step which is performed by a vapor deposition technique. The diamond-coated tool prepared by the process includes a large grain substrate surface, and an high bond strength between the diamond coating and the substrate surface.

16 Claims, 7 Drawing Sheets

U.S. PATENT DOCUMENTS

| | | |
|---|---|---|
| 4,755,399 | 7/1988 | Fujii et al. .......................... 427/277 |
| 4,843,039 | 6/1989 | Akesson et al. ...................... 501/87 |
| 4,985,070 | 1/1991 | Kitamura et al. ..................... 75/230 |
| 4,990,403 | 2/1991 | Ito ..................................... 428/408 |
| 5,028,451 | 7/1991 | Ito et al. .............................. 427/39 |
| 5,066,553 | 11/1991 | Yoshimura et al. ................. 428/698 |
| 5,068,148 * | 11/1991 | Nakahara et al. ................... 428/335 |
| 5,100,703 | 3/1992 | Saijo et al. ........................... 427/249 |
| 5,178,645 | 1/1993 | Nakamura et al. .................... 51/293 |
| 5,204,167 | 4/1993 | Saijo et al. ........................... 428/212 |
| 5,370,944 | 12/1994 | Omori et al. ........................ 428/212 |
| 5,585,176 * | 12/1996 | Grab et al. ........................... 428/336 |
| 5,618,625 | 4/1997 | Okamura ............................. 428/408 |
| 5,648,119 | 7/1997 | Grab et al. ........................... 427/249 |
| 5,660,881 | 8/1997 | Okamura ............................. 427/249 |

FOREIGN PATENT DOCUMENTS

| | | |
|---|---|---|
| 61-52363 | 3/1986 | (JP) . |
| 61-124573 | 6/1986 | (JP) . |
| 61-270373 | 11/1986 | (JP) . |
| 63-14869 | 1/1988 | (JP) . |
| 63-45372 | 2/1988 | (JP) . |
| 63-100182 | 5/1988 | (JP) . |
| 63-199870 | 8/1988 | (JP) . |
| 1246361 | 11/1988 | (JP) . |
| 1-103992 | 4/1989 | (JP) . |
| 1-201475 | 8/1989 | (JP) . |
| 1-246361 | 10/1989 | (JP) . |
| 1-255630 | 10/1989 | (JP) . |
| 63-322764 | 7/1990 | (JP) . |
| 1-50534 | 9/1990 | (JP) . |
| 4263074 | 9/1992 | (JP) . |
| 05195223 | 8/1993 | (JP) . |
| 5209274 | 8/1993 | (JP) . |

OTHER PUBLICATIONS

Saito et al., "Adhesion Diamond Film on Cemented Carbide Insert," Diamond and Related Materials, 2 (1993) pp. 1391–1395. (No Month).

Yagi, M. et al., "Cutting Performance of Diamond Cutting Tool for Al–18 mass% Si Alloy," Journal of Japan, Institute of Light Metals, vol. 39, No. 6, pp. 417–422 (1989)(Trans. and Orig. Japanese). (No Month).

Katsumura et al., "The Effects of Cobalt Content and Surface State of Substrate on Cutting Performance of Diamond Deposited Cemented Carbide Tool for Al–18% Si Alloy," Journal of Japan, Institute of Light Metals, vol. 39, No. 9, pp. 634–638 (1989)(Trans. and Orig. Japanese (No Month).

ANSI B 46.1–1978, "Surface Texture" ASME (1978) pp. 1–37. (No Month).

Saijo et al., "The Tool Life of Diamond Coatings in Milling an Al–Si Alloy,38 Applications of Diamond Films and Related Materials," ed. by Tzeng et al., Elsevier Sci. Pub. B.V. (1991). pp. 69–76. (No Month).

Yagi, Masaru, "Cutting Performance of Diamond Deposited Tool on Al–18 mass% Si Alloy," Science and Technology of New Diamond, edited by S. Saito, O. Fukunaga and M. Yoshikawa, pp. 399–404, copyright by KTK Scientific Publishers, Terra Scientific Publishing Company, 1990. (No Month).

Shibuki, Kunio; Yagi, Massaru; Saijo, Kosuke; & Takatsu, Sokichi, "Adhesion Strength of Diamond Films on Cemented Carbide Substrates," Surface & Coatings Technology, 36 (1988) pp. 295–302. (No Month).

Craig, Phillip, Senior Editor, "Thin–Film–Diamond Derby," Cutting Tool Engineering, vol. 44, No. 1, Feb. 1992, Reprinted by Crystallume Engineered Diamond Products (6 pages).

Mason, Frederick, "Diamond: the Material of the Future," American Machinist, Feb. 1990, pp. 43–46.

Cyrstallume Engineered Diamond Products Brochure, "Engineering CVD Diamond for Extaordinary Performance in Demanding Applications," (1991) (7 pages). (No Month).

Suzuki et al., "Diamond Deposition of WC–Co Cemented Carbide by Hot Filament Method," J. Jpn. Soc. Powder Metall., 33 (5) (1986) pp. 38–45) (English trans. and Japanese language copy). (No Month).

Saito et al., "Adhesion of Diamond Film on Cemented Carbide Insert," Diamond and Related Materials, 2 (1993) pp. 1391–1395. (No Month).

Haubner et al., "Diamond Growth by Hot–Filament Chemical Vapor Deposition: State of the Art," Diamond and Related Materials, 2 (1993 pp. 1277–1294. (No Month).

Yarbrough et al., "The Chemical Vapor Deposition of Diamond," Materials Science Forum, vols. 52 and 53 (1989) pp. 151–174. (No Month).

Saijo et al., "The improvement of the Adhesion Strength of Diamond Films," Surface and Coatings Technology, 43/44 (1990) pp. 30–40. (No Month).

Lux et al., "Low Pressure Synthesis of Superhard Coatings," Int. J. Ref. Met. & Hard Mater., 8 (1989) pp. 158–174. (No Month).

Kuo et al., "Adhesion and Tribological Properties of Diamond Films on Various Substrates," J. Mater. Res., vol. 5, No. 11, Nov. 1990, pp. 2515–2523.

Kikuchi et al., "Diamond Coated Inserts: Characteristics and Performance," Applications of Diamond Films and Related Materials, Ed. by Tzeng et al., (1991) pp. 61–68. (No Month).

McCune et al., "An Auger Electron Spectroscopy Study of the Surface of Ni–Mo Cemented Ti(CN) Substrates Used for Deposition of Crystalline Diamoned Particles," Surface & Coatings Technology, 39/40 (1989) pp. 223–233. (No Month).

Jindal et al., "Adhesion Measurements of Chemically Vapor Deposited & Physically Vapor Deposited Hard Coatings on WC–Co Substrates," Thin Solid Films, 154 (1987) pp. 361–375. (No Month).

"Metals Handbook Ninth Edition," vol. 7, Powder Metallurgy (1984) pp. 385–388, 398. (No Month).

Soderberg et al., "Factors Influencing the Adhesion of Diamond Coatings on Cutting Tools," Vacuum, vol. 41, No. 4–6, (1990) pp. 1317–1321. (No Month).

Murakawa et al., "Chemical Vapour Deposition of a Diamond Coating onto a Tungsten Carbide Tool Using Ethanol," Surface and Coatings Technology, 36 (1988) pp. 303–310. (No Month).

Park et al., "Behaviour of Co Binder Phase during Diamond Deposition on WC–Co Substrate," Diamond and Related Materials, 2 (1993) pp. 910–917. (No Month).

Saito et al., "Application of Diamond Films from CO–$H_2$ Plasma to Tool Blade Coating," Journal of Materials Science, 26, (1991) pp. 2937–2940. (No Month).

Nesladek et al., "Improved Adhesion of CVD Diamond Films to Steel and WC–Co Substrates," Diamond and Related Materials, 3 (1993) pp. 98–104. (No Month).

JIS B 0601 (1982) "Definitions and Designation of Surface Roughness," JIS Handbook 1989 Tools, Japanese Standards Association (1989) pp. 2245–2255. (No Month).

"Surface Texture and Roundness Measurement Handbook," Sheffield Measurement Division, Warner & Swasey (1988) pp. 47, 48. (No Month).

Tulhoff, "On the grain Growth of WC in Cemented Carbides," Modern Developments in Powder Metallurgy, ed. by Hausner et al., vol. 14, Special Materials (1981) pp. 269–279. (No Month).

Rudiger et al., "On the Problem of Evaporation of the Auxiliary Metal During Vacuum Sintering of Hard Metals," Int'l. Symp. on Powder Met., Paris, Jun. 1964, pp. 259–269.

Gaser, "Edge and Surface Honing on Various Shaped PCD & CBN Inserts," SME Technical Paper MR92–357 (1992). (No Month).

Scheider, "Edge Grinding and Radiusing with Superabrasives," MAN, Sep. 1992, pp. 46–47.

Hosomi et al., "Diamond CVD Researches as Patent Applied," Applications of Diamond Films and Related Materials, ed. by Tzeng et al., Proceedings of Auburn University Conference, Aug. 1991, Elsevier Science Publishers B.V., (1991) pp. 15–24.

Israelsson, "A Progress Report on Cutting Tool Materials," American Machinist, Dec. 1992, pp. 39, 40.

"Advanced Cutting Tool Materials," Kennametal Catalogue No.A90–67 (1988) pp. 1,2,77–86, 98–98, 101 and 102. (No Month).

"Standard Test Method for Apparent Porosity in Cemented Carbides," ASTM Designation: B276–86. (No Date).

"American National Standard for Cutting Tools—Indexable Inserts—Identification System" ANSI B212,4–1986. (No Month).

Eastman et al., "Machining MMCs," Cutting Tool Engineering, Oct. 1993, pp. 38, 40–44.

Schneider, "Precision Edge Radius Grining of Diamond Cutting Tools and Inserts," SME Technicl Paper MR91–195 (1991). (No Month).

Scheider, "New Abrasive Edge and Surface Preparation Tools, Techniques and Technology for Fabricated Material Applications," SME Technical Paper FC91–426 (1991). (No Month).

* cited by examiner

DIAMOND COATED TOOLS AND PROCESS FOR MAKING

This is a continuation of application Ser. No. 08/159,272 filed on Nov. 30, 1993, now U.S. Pat. No. 5,585,176.

TECHNICAL FIELD

The present invention relates to a tool having a strongly adherent diamond coating deposited thereupon and to a process for making this product. It is especially concerned with diamond coated cutting tools for chip forming machining and a process for making them.

BACKGROUND

In recent years, chemical vapor deposition (CVD) diamond coatings have been applied to a variety of substrate-material cutting tools intended for the same applications as single point, brazed-on polycrystalline diamond (PCD) tipped tools (see "Advanced Cutting Tool Materials," Kennametal Inc. (1988), Pages 1, 2, 77–86, 94–98, 101 and 102). While CVD diamond coated tools provide the machinist with multiple cutting edges on inserts with or without chipbreaker structures, their inconsistent machining results, due to poor coating adhesion, has resulted in a failure of the CVD diamond coated tools to be competitive with PCD tools in most commercial applications.

Various approaches have been made to the formation-of diamond coating layers on various surfaces by CVD methods (e.g., hot filament, DC plasma jet and microwave plasma) in which gases such as methane ($CH_4$) are thermally decomposed. However, diamond coating layers formed by low pressure vapor-phase synthesis methods generally have a low adhesive bond strength to the substrate. Accordingly, what is desired is a coated substrate in which the adherence of the coating to the substrate is sufficient to retain the coating on the substrate for the time that it takes for the coating to gradually wear out by abrasion during machining of a workpiece material. Early or premature flaking of the coating prior to the wearing out of the coating causes unpredictable and inconsistent tool lifetimes, which is unacceptable to most users of PCD tipped tools. In addition, the diamond coating thickness should be thick enough so that each cutting edge provides at least forty percent of the wear life of PCD tools in order to be competitive with those tools.

One approach to this problem is disclosed in U.S. Pat. No. 5,068,148, which issued on Nov. 26, 1991. The '148 reference discloses a method for producing a diamond coated tool member wherein a cemented carbide substrate is chemically etched to remove cobalt existing in the outermost portion of the substrate. Such etching steps may generate internal interconnecting porosity which diminishes the toughness and wear resistance of the cutting tool insert, but absent chemical etching, tool performance may diminish due to coating delamination caused by poor preparation of the substrate surface (e.g., too much cobalt left on the surface). The '148 reference calls for heat-treating a ground substrate at a temperature between 1000° C.–1600° C. for 30 to 90 minutes in a vacuum or in a non-oxidizing atmosphere before chemical etching. If the heat treating temperature exceeds 1600° C., the hard grains of the substrate become bulky, and the surface of the substrate becomes extraordinarily rough, so that the substrate cannot be used for manufacturing a tool member.

In another approach, disclosed in European patent application Ser. No. 0 518 587, the surfaces of a cemented tungsten carbide substrate are also etched for the purpose of improving diamond coating adherence.

It is the inventors' belief, after examination of diamond coated cemented carbide tools presently being commercially marketed, that where an etching step is used to improve diamond adhesion (to 60 to 100 kg in the Rockwell A indentation adhesion test), etching has preferentially removed significant amounts of cobalt from the surface and from just beneath the surface. This results in interconnected porosity just beneath the substrate surface, creating a weakened structure which undermines the ability of the diamond coating to remain attached to the tool during machining operations, and which results in flaking of the coating, especially during interrupted machining operations.

U.S. Pat. No. 5,204,167, which issued on Apr. 20, 1993, discloses a diamond coated sintered body in which the average size of recrystallized tungsten carbide in the surface layer is finer as compared with that existing in the inner portions of the substrate. The '167 reference teaches that increased adhesion between the diamond film and the substrate is because graphite generated at an initial stage of diamond deposition is used for recarburization of a surface decarburized layer of the substrate, so that graphite formed at the interface between the surface layer and the film is decreased.

Such approaches leave unsolved the challenge of providing a high bond strength between the coating and the substrate.

Current practice in the design of conventional, PCD cutting tools calls for the tool to have a sharp cutting edge for both turning and milling applications on non-ferrous and non-metallic workpieces. The use of sharp edges provides lower cutting tool forces during machining and workpiece surface finishes having the required characteristics, e.g., low surface roughness.

Diamond coated cutting tool inserts should ideally provide the same workpiece surface characteristics to be commercially competitive with conventional PCD tools. Another one of the factors currently limiting the acceptance of diamond coated tools has been the difficulty of providing acceptable workpiece surface finishes, especially in finishing operations. Conventional PCD tools often contain a metallic binder, such as cobalt, which holds the diamond particles together. When properly ground, the PCD provides a substantially smooth cutting surface and imparts a substantially smooth surface to the workpiece. In contrast, diamond coatings do not contain a binder phase. They typically have a rough, faceted surface on a microscopic scale. Such microscopic roughness leads to rough workpiece finishes in cutting operations. Under prior approaches, the purer (or more perfect) the diamond coating, i.e., more $sp^3$ and less $sp^2$ (graphitic) bonded component, the more highly faceted the coating becomes. Such coatings can be made smoother by increasing the amount of graphitic component, but wear resistance, and tool lifetime, decrease as a result. Although chemical polishing with reactive materials and compounds or mechanical polishing with diamond grit may be used to produce a smooth diamond surface, the road remained open for improved approaches.

Accordingly, it would be desirable to provide a high purity diamond coating on a cutting tool substrate that will be highly adherent in use, and will preferably achieve workpiece surface finishes comparable to those provided by conventional PCD tools.

Until the present invention, there remained an unsolved need for simple, yet effective techniques for consistently providing a highly adherent diamond coating and for providing a smooth surface of a high purity, highly faceted diamond coating on a three-dimensional shape, e.g., a cutting tool insert.

SUMMARY OF THE INVENTION

The product according to the present invention is directed to a diamond coated tool, preferably a cutting tool for chip forming machining of materials.

The tool has a cermet substrate, to which a diamond coating is adherently bonded. The cermet substrate has hard grains bonded together by a metallic binder. At the substrate surface, there are hard grains that are large. These large, hard grains provide the substrate with an irregular surface. The diamond coating has a strong adhesion to the irregular substrate surface. Where the tool is a cutting tool for chip forming machining of a material, the substrate has a flank surface and a rake surface and a cutting edge formed at the juncture of the rake and flank surfaces. The diamond coating is adherently bonded to each of these surfaces. The substrate, in accordance with the present invention, is also preferably characterized by an absence of interconnected porosity in the substrate regions adjacent to the irregular substrate surfaces to which the diamond coating is bonded.

In a preferred embodiment of the present product, the cermet substrate is a tungsten carbide based (i.e., >50 w/o WC) cemented carbide and said hard grains include tungsten carbide grains.

Preferably, the metallic binder forms about 0.2 to 20 w/o of the tungsten carbide based cemented carbide and the metallic binder is selected from the group of cobalt, cobalt alloys, iron, iron alloys, nickel and nickel alloys.

In a more preferred embodiment, the metallic binder is cobalt, or a cobalt alloy, and cobalt forms about 0.5 to about 7 weight percent, and most preferably, about 1.0 to about 7 weight percent of the tungsten carbide based cemented carbide.

Preferably, the average adhesion strength of the diamond coating to the substrate surface is at least 45 kg, and more preferably, at least 60 kg, and most preferably, at least 80 kg in Rockwell A indentation tests.

The diamond coating on the rake face of cutting tools preferably has an average thickness of about 5 to about 100 μm, with about 22 to about 50 being preferable for tools to be used in continuous and interrupted finish turning of aluminum alloys such as A380 and A390 to obtain acceptable tool lives at a reasonable manufacturing cost.

In a preferred option, especially for finish machining applications, the diamond coating adherently bonded to the rake face is substantially left in its as-deposited rough surface condition, preferably, having a surface roughness, $R_a$, of greater than 35 microinches, while the diamond coating adherently bonded to the flank surface is made smoother.

The product according to the present invention is preferably made by a process, also in accordance with the present invention, which comprises the steps of:

1. Sintering a cermet substrate for a time, at a temperature and in an atmosphere to produce grain growth on the substrate surfaces sufficient to provide the substrate rake surface with a surface roughness, $R_a$, of greater than 25 microinches, while reducing the concentration of metallic binder on that surface. Preferably, the surface roughness, $R_a$, produced in the sintering step, is greater than 30 microinches, and more preferably, at least 40 microinches. The atmosphere used, preferably, is nitrogen, at a partial pressure of about 0.3 to about 50 torr, preferably, about 0.3 to 5 torr, more preferably, about 0.3 to 2.0 torr, and most preferably, about 0.3 to 0.7 torr.

2. These surfaces are then diamond coated by adherently depositing, by vapor deposition, a diamond coating thereon. Preferably, the substrate temperature during the diamond deposition process is between 700° C. and 875° C., and is more preferably, about 750° C. to about 850° C.

This process is controlled to produce an average adhesion strength between the diamond coating and the substrate of greater than 45 kg, preferably, at least 60 kg, and more preferably, at least 80 kg, as determined by the Rockwell A indentation technique.

Preferably, following the sintering step, the surfaces of the substrate to be coated are scratched with diamond to create diamond nucleation sites in preparation for diamond coating.

In another preferred embodiment of the present invention, the step of smoothing the surface roughness of the diamond on the flank face of the tool is performed, preferably, by buffing the flank face.

In still a further preferred embodiment of the present invention, the cermet substrate prior to the sintering step described above is at least substantially fully densified (i.e., has been previously sintered) and has a surface which is in a ground condition.

These and other aspects of the present invention will become more apparent upon review of the detailed description of the invention in conjunction with the drawings, which are briefly described below.

DETAILED DESCRIPTION OF THE INVENTION

Figure 1A:
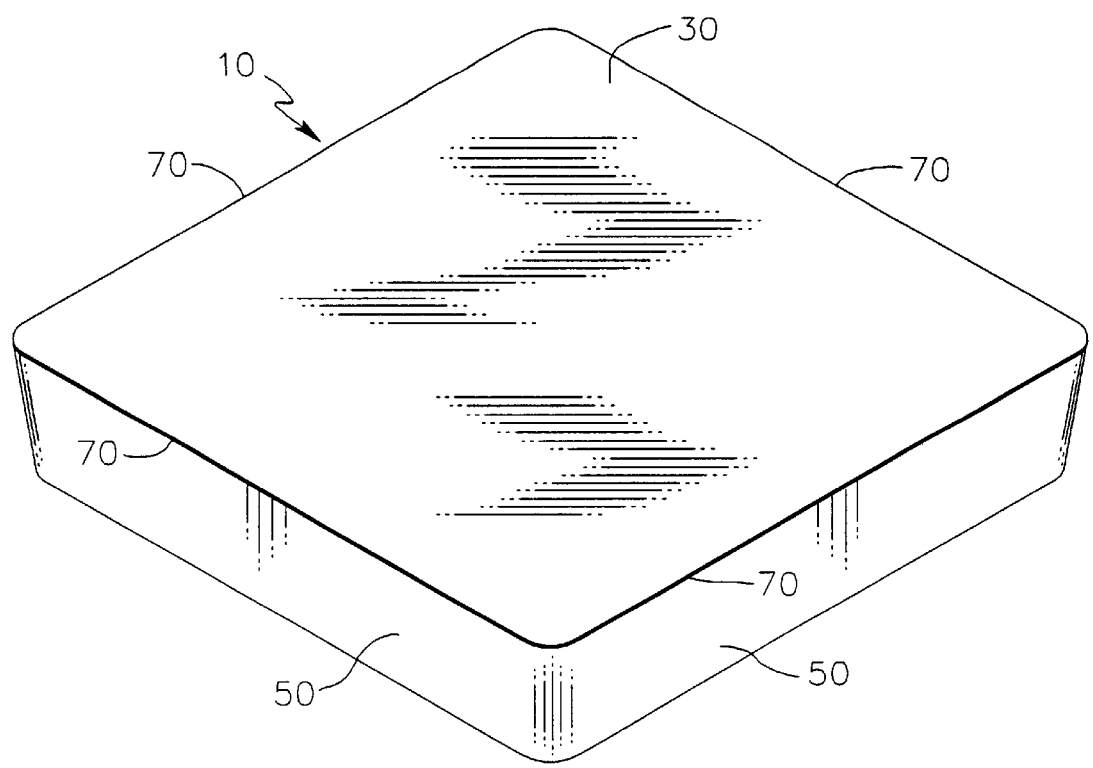
FIG. 1A shows an embodiment of a cutting tool substrate in accordance with the present invention.

In accordance with the present invention, FIG. 1A shows a preferred embodiment of an indexable cutting tool substrate to be coated with diamond in accordance with the present invention. The tool substrate has a rake surface 30 and flank surface 50. At the juncture of the rake surface 30 and the flank surface 50 is a cutting edge 70. The cutting edge 70 may be in either a sharp, honed, chamfered, or chamfered and honed condition, depending on application requirements. The hone may be any of the styles or sizes of hones used in the cutting tool industry. Preferably, the cutting edge has a radius hone, preferably, of about 0.0005 to 0.0015 inch. The cutting tool substrate may also be made in any of the standard shapes and sizes (for example, SNGN-422 and TPGN-322 (see ANSI B212.4-1986)). Inserts may also have various chipbreaker structures (not shown) on their rake face as well to facilitate breakage and removal of chips. Where chipbreaker structures are to be coated, some or all of these structures may be in an as-molded condition (i.e., unground).

Figure 1B:
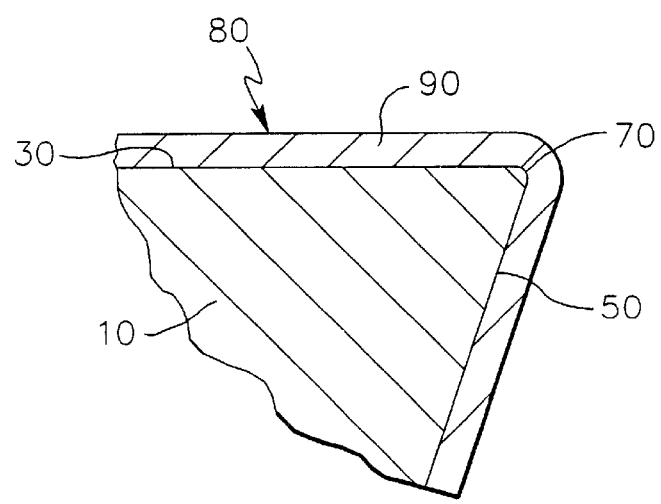
FIG. 1B shows a partial cross section through the cutting tool substrate of FIG. 1A perpendicular to a cutting edge after it has been coated in accordance with the present invention.

In accordance with the present invention, FIG. 1B shows a partial cross section through the coated cutting tool 80 which is composed of the cermet substrate 10, shown in FIG. 1A, with a diamond coating 90 adherently bonded to its rake surface 30, flank surfaces 50 and cutting edges 70. The bottom surface of the substrate 10 may or may not be coated with diamond.

The substrate used in the present invention is a cermet having hard grains and a metallic binder holding said hard grains together. The cermet composition may be any of those used in the prior art for cutting tool applications and include titanium carbonitride based and tungsten carbide based compositions. The metallic binder utilized in these compositions include cobalt, cobalt alloys, nickel, nickel alloys, iron and iron alloys.

Preferably, a tungsten carbide based (>50 w/o WC) cemented carbide is utilized for the substrate. Such a composition should have about 0.5 to about 20 w/o, preferably, 1.0 to 7 w/o, metallic binder of cobalt or a cobalt alloy. Such a composition would contain hard tungsten carbide grains and may also contain other hard grains, including carbides, nitrides and carbonitrides of other elements, solid solution carbides and solid solution carbonitrides of tungsten and other elements. Such elements may include Ti, Hf, Zr, Ta, Nb, V, Mo and Cr. In a preferred embodiment, the presence of Ti, Hf, Zr, Ta, Nb, V, Mo and Cr is limited to less than 1 w/o, and more preferably, less than 0.6 w/o total, such that the cemented carbide substrate consists essentially of tungsten carbide and cobalt or a cobalt alloy (such as a Co-W alloy).

For example, applicants have found that the present invention provides particularly good adhesion results when two tungsten carbide based cemented carbide compositions are used for the starting material for the substrate, as follows:

Alloy A: W +C +5.7 to 6.3 w/o Co, up to 0.1 w/o Ta, up to 0.1 w/o Ti, up to 0.1 w/o Nb, 0.3 to 0.5 w/o Cr, remainder other impurities, Rockwell A hardness 92.6 to 93.4, coercive force, Hc, 250–320 oersteds, magnetic saturation 83 to 95%, average WC grain size 1–5 $\mu$m and a porosity rating of A04, B00, C00 or better, density 14.80 to 15.00 g/cc.

Alloy B: W+C+2.3 to 2.9 w/o Co, up to 0.4 w/o Ta, up to 0.1 w/o Ti, up to 0.1 w/o Nb, remainder other impurities, Rockwell A hardness 92.8 to 93.6, coercive force, Hc, 290–440 oersteds, magnetic saturation sufficient to avoid eta phase, average WC grain size 1–6 $\mu$m, porosity rating of A08, B00, C00 or better, density 15.10 to 15.50 g/cc.

Figure 2:
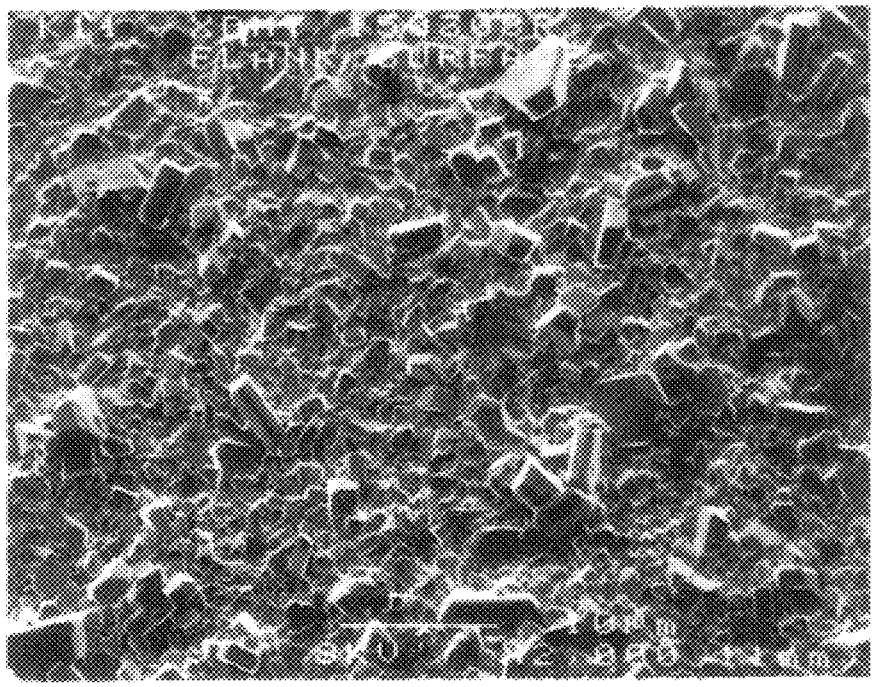
FIGS. 2–11 are scanning electron microscopy (SEM) photomicrographs which depict secondary electron images (SEI) of a cutting tool at various stages in a preferred embodiment of the process and product of the present invention. (All figures are at 2000×magnification, except for FIG. 10, which is at 1000×.)
Figure 3:
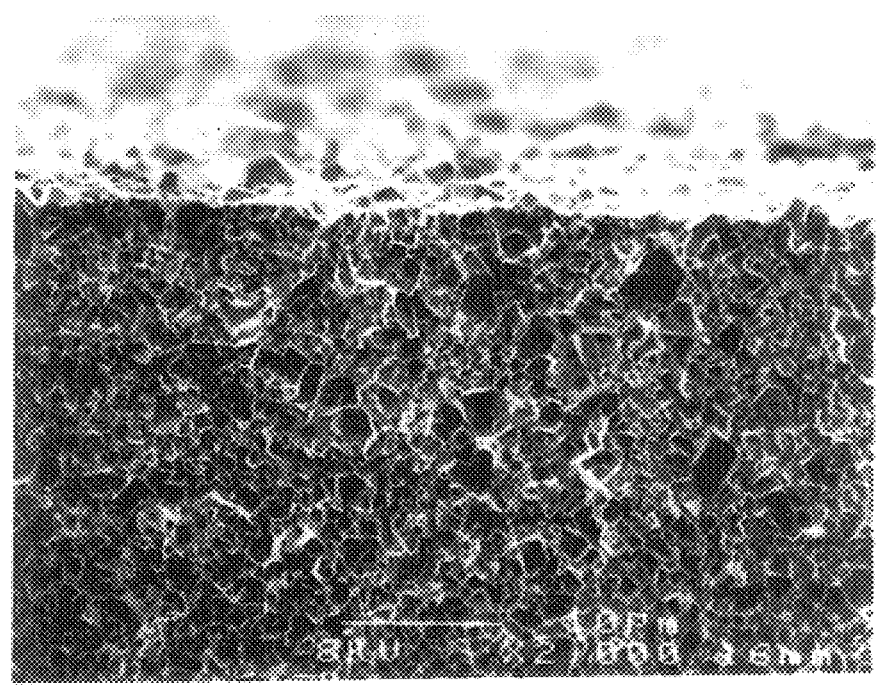

FIG. 2 shows a SEM photomicrograph of an Alloy B starting material substrate flank surface at 2000×. FIG. 3 shows a SEM photomicrograph of a fracture cross section of the same material at 2000×. Both photomicrographs show the substrate in an as-sintered condition. It will be noted in the photomicrographs that the average hard grain size (here WC) at the surface of the substrate is approximately the same as that in the interior.

While this material was fabricated by cold pressing and vacuum ($10^{-2}$ to $10^{-3}$ torr) sintering techniques, it should be understood that any of conventional techniques may be used to obtain the starting material for the present invention, e.g., cold pressing, cold pressing and sintering (vacuum, pressure or hot isostatic pressing or any combination thereof) or hot pressing. The surface of an as-vacuum sintered tungsten carbide based cemented carbide substrate is composed of tungsten carbide hard grains bound together by cobalt or a cobalt alloy. The cobalt is not only between the tungsten carbide grains, but also covers some of the tungsten carbide grains at the substrate surface due to the wetting properties of Co and WC under vacuum sintering conditions.

Figure 4:
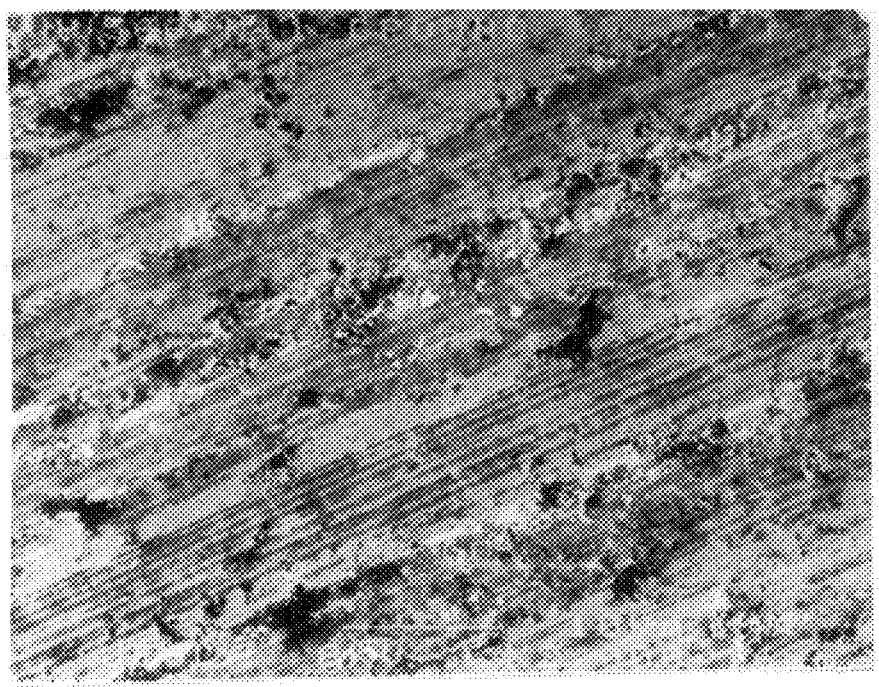
Figure 5:
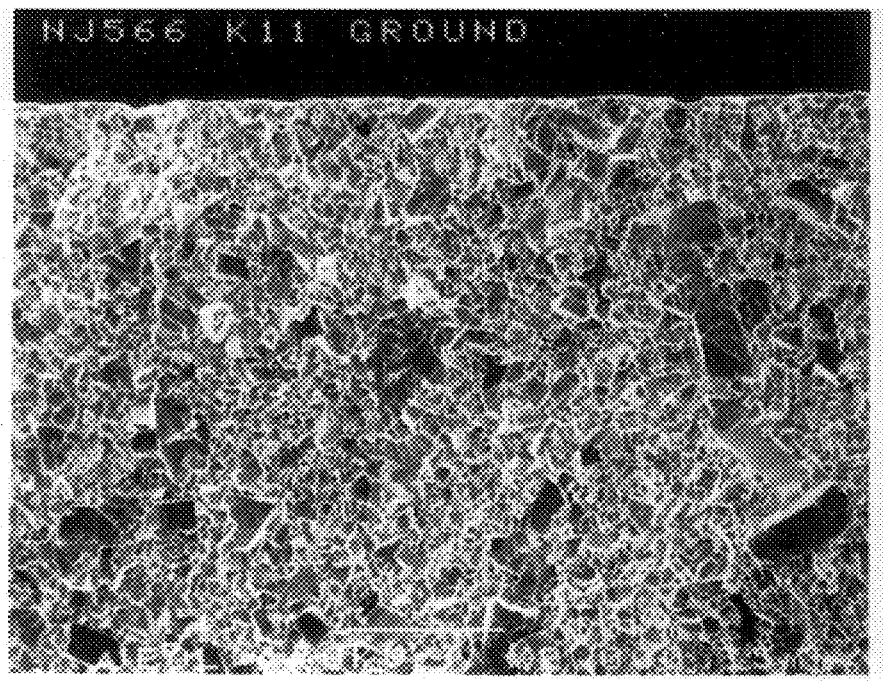

Typically, the as-sintered substrate is wholly or partially ground (e.g., chipbreaker structures on the rake surface may be left in an as-molded condition) to provide exact dimensional control of the substrate. Operations, such as grinding and honing, (which may also be performed at this stage of manufacture) act to smear the cobalt over the surfaces of the substrate. An Alloy B ground rake surface is shown in FIG. 4. FIG. 5 shows a fracture cross section through the as-ground Alloy B insert, in which it will be noted that the grinding has smoothed the surface roughness of the substrate compared to that shown in FIGS. 2 and 3.

Now in accordance with the present invention, the substrate described above is now sintered (or re-sintered) under time, temperature and atmospheric conditions, to cause grain growth and binder depletion from its surfaces. The time and temperature are selected such that sufficient abnormal or exaggerated grain growth occurs on the surface of the substrate to produce a surface roughness, $R_a$, of greater than 25 microinches, preferably, greater than 30 microinches, and more preferably, at least 40 microinches.

Figure 6:
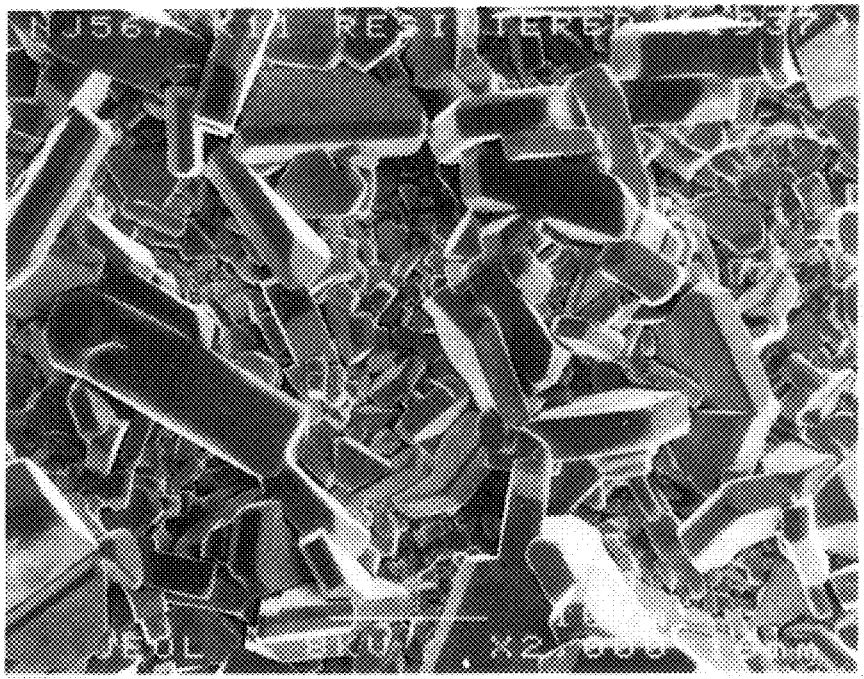
Figure 7:
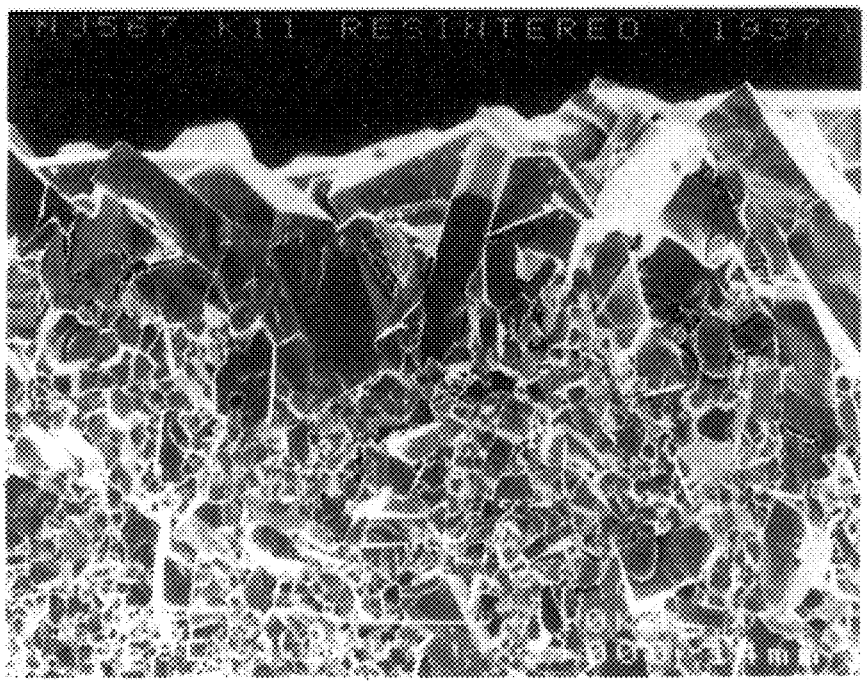

FIGS. 6 and 7 illustrate the results of this re-sintering step through photomicrographs (2000×) of the surface morphology (FIG. 6) and fracture cross section (FIG. 7) of a rake surface of a re-sintered Alloy B insert. FIGS. 6 and 7 show that the surface may have a mixture of large and small grains. The large grains shown at the surface, preferably include grains having a major dimension with a size of at least 10 $\mu$m, and more preferably, at least 15 $\mu$m to produce the desired degree of surface roughness.

SEM energy dispersive line scan x-ray analysis (EDS) of polished cross sections of Alloy B substrates in the sintered and ground state, and in a re-sintered state, have shown that cobalt is being evaporated from the substrates during re-sintering. Before re-sintering, EDS and optical metallography showed that the as-sintered and ground substrates (substrates included an as-molded chipbreaker structure (nonground) e.g., CPGM-21.51) had a cobalt content of about 2.7 to 2.8 w/o (about 2.9 w/o by x-ray fluorescence) throughout, with scattered pools of cobalt throughout the samples, an A06 to A10 porosity rating, and a typical tungsten carbide grain size of about 1 to 6 $\mu$m, with a few scattered grains throughout, up to about 10 $\mu$m.

After re-sintering, in accordance with the present invention, cobalt content and cobalt pool size was reduced, the porosity rating was improved, and the tungsten carbide grain size was increased. The porosity rating was A02 to A06 (no interconnected porosity was observed near the surface regions of the samples, or anywhere else in the samples). The tungsten carbide grain size was non-uniform and ranged from about 1 to 11 $\mu$m, with the larger grains and/or the frequency of larger grains being higher at the surfaces of the samples. Large grains, up to 16 to 28 $\mu$m in size, were observed. In the CPGM-21.51 sample, large grains were produced on as-molded surfaces as well as ground surfaces. In a CPGN-422 sample, the cobalt content was substantially uniformly reduced throughout, to about 2 w/o (EDS and x-ray fluorescence). In a CPGM-21.51 sample, the cobalt content was substantially uniformly reduced throughout, to about 0.5 w/o. In both samples, the variability in cobalt content about the mean was also reduced, indicating a reduction in cobalt pool size (i.e., a more uniform distribution of cobalt). The difference in the amount of cobalt evaporation from the CPGN-422 and CPGM-21.51 samples indicates that the amount of cobalt evaporation is also a function of insert surface area to volume ratio. As this ratio increases, the amount of cobalt evaporation for a given re-sintering treatment should increase.

Re-sintering was performed at 2750° F. for three hours in about 0.5 torr nitrogen atmosphere. The times required to achieve the required surface roughness will depend on the starting material and the sintering conditions. As temperature increases, sintering times should decrease. With Alloy B sintered and ground substrates, the re-sintering times of 2 to 3 hours at 1510° C. (2750° F.) have been found to be sufficient to provide the needed surface roughness. In Alloy A, longer sintering times have been found to be necessary.

If the desired surface roughness is not produced after the first re-sintering treatment, the substrate may be re-sintered again until the desired surface roughness is produced.

It is believed that the atmosphere during the sintering (or re-sintering) treatment, in accordance with the present invention, is also important to obtaining good diamond coating adhesion to the substrate. It is believed that, if a nitrogen atmosphere is utilized during this treatment, the amount of cobalt on the resulting rough surface will be minimized. The nitrogen partial pressure should be controlled to allow cobalt evaporation from the surface, while minimizing re-wetting of the surface by additional cobalt from the bulk of the substrate and while preferably avoiding any noticeable formation of a nitride layer on the surface of the substrate.

The most beneficial nitrogen partial pressure may, therefore, be a function of the substrate composition. Nitrogen partial pressure may also be controlled or varied during the re-sintering cycle(s) to control the amount and rate of cobalt evaporation from the bulk of the substrate.

It is believed that a 0.3 to 50 torr, preferably, 0.3 to 5, and more preferably, 0.3 to 2 torr nitrogen atmosphere should be utilized. Applicants' best results have been achieved with a nitrogen atmosphere of 0.3 to 0.7 torr with the Alloy B grade in their furnace. It is theorized that the nitrogen atmosphere may allow cobalt on the exterior surfaces of the grains on the substrate surface to evaporate, while sufficient cobalt remains between the surface tungsten carbide grains to keep them well bonded to the remainder of the substrate. Cobalt surface evaporation is accompanied by tungsten carbide grain growth at the surface, resulting in surface roughening.

The rake and flank surfaces of the cutting tool substrate may then be beneficially scratched by any conventional means (e.g., diamond grit or diamond paste) to create nucleation sites in preparation for diamond coating.

Diamond coating of the substrates is then accomplished by a vapor deposition technique (e.g., hot filament, DC plasma jet or microwave plasma). In the application of the diamond coating, it is preferred that the substrate temperature during coating be maintained between 700 and 875° C. Below about 700° C., too much graphite is formed in the diamond coating and the wear resistance is thereby significantly reduced. In addition, the rate of coating is also reduced. Above about 875° C., too much cobalt diffuses from the substrate during coating and the adhesion of the diamond to the substrate is adversely affected. It has been found to be more preferable to perform diamond coating at about 750° C. to about 850° C. At these temperatures, the adverse conditions mentioned above can be minimized and a reasonable coating rate can be obtained.

Figure 8:
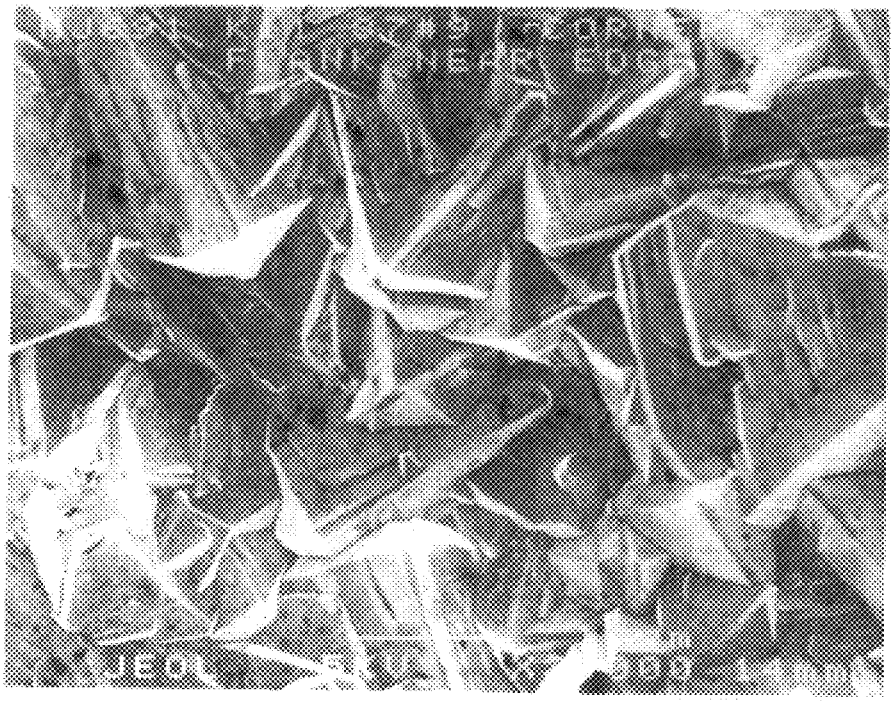

FIG. 8 (2000×) depicts the surface morphology of an as-deposited diamond coating on the flank surface of a cutting tool in accordance with the present invention. The rough faceted surface shown is indicative of a high purity diamond coating having minimal, if any, $SP^2$ phase (graphite) and binder from the substrate. This diamond coating was produced in a CVD hot filament system.

Figure 9:
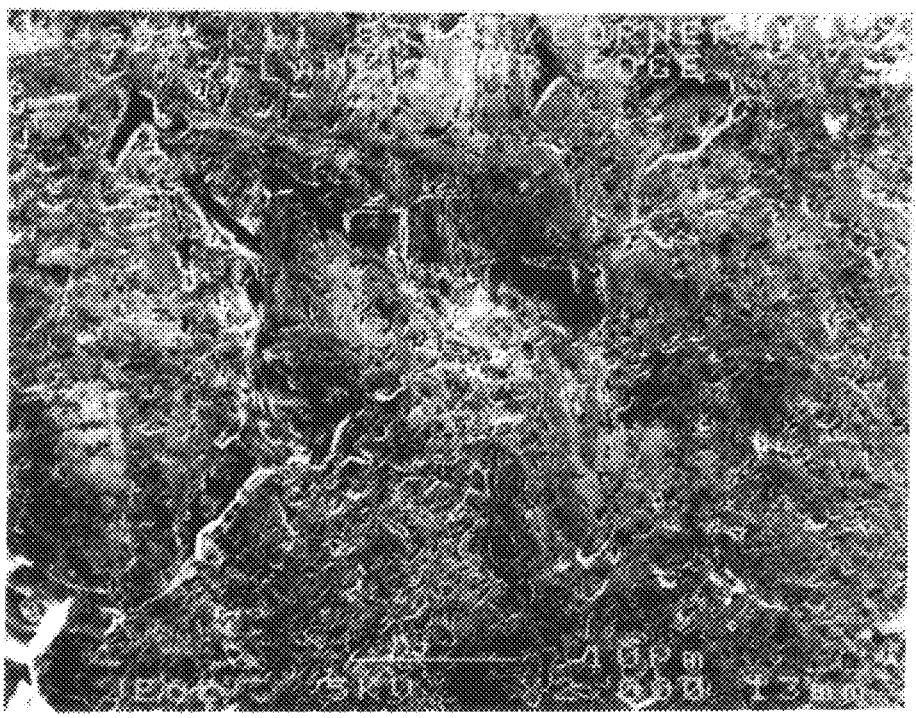

FIG. 9 (2000×) illustrates a diamond coating surface on a flank face of an insert after it has been buffed. By comparing FIGS. 8 and 9, one can readily see the smoothing effect that buffing has on the surface morphology of the diamond coating. Buffing is performed to eliminate the higher surface asperities on the surface of the diamond coating on the flank surface in order to improve the surface finish that will be imparted to the workpiece being machined. Preferably, sufficient buffing is performed such that the surface roughness, $R_a$, of the flank surface near the corners of the insert is reduced by at least 10 microinches.

Figure 10:
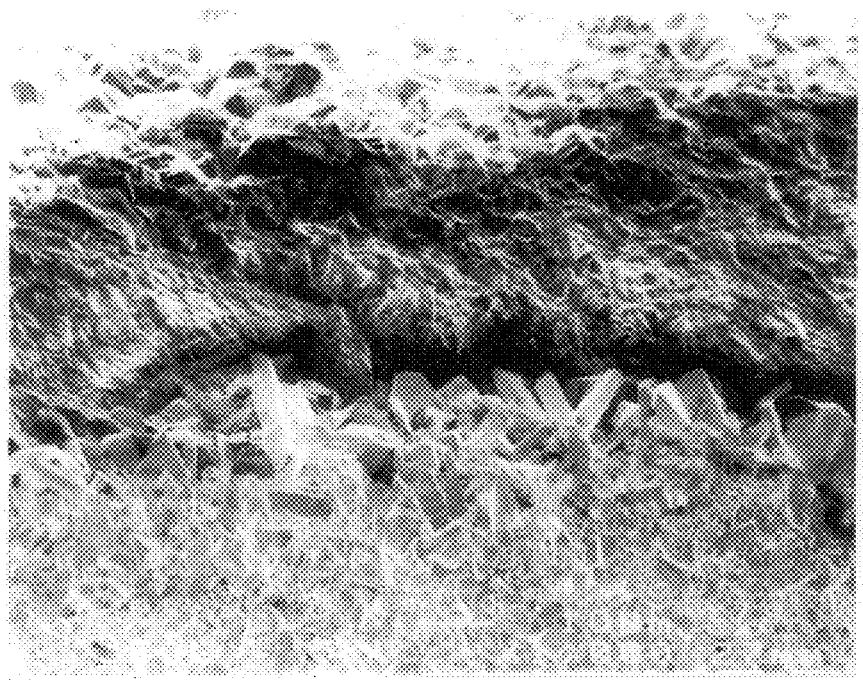
Figure 11:
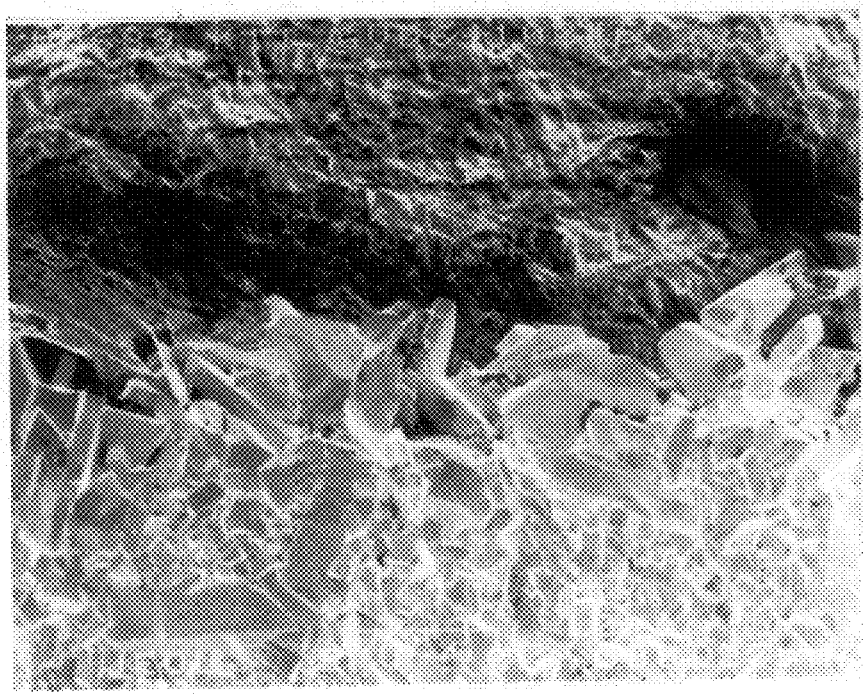

Turning next to FIGS. 10–11, there are respectively depicted fracture cross sections of a rake surface of a diamond coated/re-sintered cutting tool insert interface. FIG. 10 is taken at a magnification factor of 1000, while the magnification factor of FIG. 11 is 2000. These figures show mechanical interlocking of the coating with the irregular rake surface of the substrate created by the large tungsten carbide surface grains. It is theorized that the minimization of the cobalt on the surfaces of the tungsten carbide grains enhances direct nucleation of the diamond on the tungsten carbide. Both enhanced nucleation and mechanical interlocking improve the adhesion of the diamond coating.

Adhesive strength of diamond coatings on cermet inserts is a complex function of intrinsic and extrinsic parameters. They include surface roughness, chemical compatibility of the surfaces, compatibility of thermal expansion coefficients, surface preparation, nucleation density and coating temperature. In polycrystalline diamond coatings on carbide inserts, adhesive strength is substantially reduced by the binder concentration on the cermet surface. The re-sintering step of the present invention is believed to achieve the goal of creating sufficient binder (e.g., cobalt) depletion to achieve good diamond to substrate bonding, but not so much cobalt depletion so as to significantly weaken the bonding of the surface WC grains to the remainder of the substrate. The need for etching of the substrate surface to remove cobalt therefrom, with its attendant formation of interconnected porosity in the regions adjacent to the substrate surface, has been avoided.

The efficacy of the disclosed process is additionally illustrated by the following further examples.

In another experiment, SPGN-422 style blanks were pill-pressed at 30,000 psi out of a Alloy B grade powder blend. The blanks were then sintered at 1496° C. (2725° F.) for 30 minutes in a conventional vacuum cemented carbide sintering cycle. They were then ground to the SPGN-422 dimensions and reheated in a re-sintering cycle as listed in Table I. The partial pressure of the nitrogen atmosphere in which the re-sintering step was performed was approximately 0.5 torr at the load which was in a directly pumped gas permeable graphite box through which about 2.5–3.0 liters/minute of nitrogen was continually flowing. Nitrogen was first introduced at about 538° C. (1000° F.) during heating to the re-sintering temperature and maintained thereafter, until 1149° C. (2100° F.) was reached during cooling. At that time, the nitrogen was replaced by helium.

Following re-sintering, the surface roughness of the reheated inserts was measured with a standard Sheffield Proficorder Spectre unit. The measurements were performed in two sites on the inserts. Then the inserts were: (1) ultrasonically cleaned (sonicated in a micro-clean solution in water, rinsed with water, sonicated in acetone, and finally in methanol); (2) diamond seeded (by either hand scratching with 0.25 µm diamond paste or by sonicating in a slurry of 0.5 to 3 µm diamond powder in 100 ml of acetone); and (3) diamond-coated in a CVD hot filament system (in a mixture of 1% methane and 99% hydrogen, at 10 torr total gas pressure and at a substrate temperature of about 775 to about 850° C.) to produce a diamond coating thickness of about 5 to 10 µm.

Adhesion between the diamond coating and the carbide surface was determined by an indentation adhesion test using a Rockwell hardness tester with a Rockwell A scale Brale cone shaped diamond indenter at a selected load range: 15 kg, 30 kg, 45 kg, 60 kg and 100 kg. The adhesive strength was defined as the minimum load at which the coating debonded and/or flaked. Measurements were performed at two sites on the inserts.

Typical re-sintering conditions, the resulting substrate surface roughness and the corresponding adhesion values are summarized in Table I. Substrate weight changes (losses) during re-sintering confirm that cobalt is being evaporated from the samples during re-sintering. The higher the weight change ratio, the greater the cobalt loss. In these examples, acceptable adhesion results were achieved at weight ratios of 1.0030 to 1.0170, in combination with surface roughnesses of 27 to 61 microinches. These weight change ratios indicate that, in substrates having about 2.7 w/o cobalt before re-sintering, after re-sintering, the cobalt content has been reduced to about 2.4 to 1.0 w/o. While it is desirable to increase surface roughness to achieve improved interlocking between the substrate surface and the diamond coating, the weight change ratio should preferably be as small as possible, commensurate with obtaining the desired level of surface roughness that is necessary to achieve good bonding with the coating.

In general, samples with higher substrate surface roughness exhibit higher adhesive strength. Samples sintered for only one hour at 1454° C. (2650° F.) had insufficient surface roughness, insufficient coating to substrate adhesion, and had a much smaller weight loss (i.e., cobalt loss) than the samples sintered for longer times in accordance with the present invention.

In another experiment, coated inserts prepared in a similar manner to the previous experiment were evaluated in a metalcutting test. In general, samples with a higher substrate surface roughness exhibited improved performance. In still further examples, shown in Table II, additional samples of sintered and ground Alloy B substrates and samples of sintered and ground Alloy A substrates were re-sintered as shown in Table II using a 0.5 torr nitrogen atmosphere as before. The substrate weight change ratio on samples 608A3 and 608A4 were, respectively, 1.0088 and 1.0069. The weight changes due to re-sintering in the other samples listed in Table II were not measured. As can be seen from the Table, the alloy A substrates were subjected to two re-sintering runs to obtain the desired surface roughnesses and the desired indentation adhesion values. It is believed that longer re-sintering times are necessary to achieve equivalent surface roughnesses and indentation adhesion values to those obtained in Alloy B due to the addition of chromium (a grain growth inhibitor) and/or the higher cobalt content of Alloy A. The diamond coatings placed on these samples had a thickness of about 25 µm in the corners of the rake face (21 mg weight change is approximately equivalent to a 25 µm coating thickness on a SPGN-422 style insert).

The inventors surprisingly found that diamond coated cutting inserts in accordance with the present invention, in turning of A380 and A390 type aluminum alloys, exhibit wear lives of at least 40, and more preferably, about 60% of PCD tipped tools, fail by abrasive wear (not flaking) and have similar lifetimes and failure modes in interrupted turning of these materials, as well. This is the first time, to the inventors' knowledge, that a diamond coated cutting tool has been produced that will consistently resist flaking in interrupted turning of these materials. This allows consistent tool lives to be achieved and predicted—a step that is necessary if diamond coated tools are to be commercially competitive with PCD tipped tools. The machining test results described above were accomplished with diamond coating thicknesses of about 25 µm as measured on the rake face near the corners of a an Alloy B type insert substrate.

TABLE I

EFFECT OF RE-SINTERING ON ROUGHNESS AND ADHESION

| SAMPLE NO. | RE-SINTERING CONDITION TEMP/TIME ° C./MIN. | SUBSTRATE WEIGHT CHANGE RATIO** | SUBSTRATE SURFACE ROUGHNESS, $R_a$ MICROINCHES | DIAMOND COATING WEIGHT GAIN mg | INDENTATION ADHESION kg |
|---|---|---|---|---|---|
| Ground | NONE | | 5–5 | | *-15 |
| 1624-1 | 1454/60 | 1.0016 | 13–14 | 4.58 | 30–45 |
| 1629-6 | 1454/60 | 1.0020 | 17–20 | 8.62 | 45–45 |
| 1623-3 | 1454/120 | 1.0030 | 27–28 | 8.73 | 60–100 |
| 1628-6 | 1454/120 | 1.0073 | 33–39 | 8.96 | 60–60 |
| 1622-2 | 1510/120 | 1.0048 | 40–40 | 5.37 | 100–100 |
| 1627-4 | 1510/120 | 1.0170 | 58–61 | 7.66 | 60–100 |

*spontaneous flaking
**due to re-sintering process (weight before/weight after)

TABLE II

| SAMPLE NO. | RE-SINTERING CONDITION TEMP/TIME ° C./MIN. | SUBSTRATE SURFACE ROUGHNESS, $R_a$ MICROINCHES* | DIAMOND COATING SURFACE ROUGHNESS, $R_a$ MICROINCHES* | DIAMOND COATING WEIGHT GAIN mg | INDENTATION ADHESION kg |
|---|---|---|---|---|---|
| 608E2 | 1510/180 | 45/50 | 45/58 | 19.74 | 60/100 |
| 608E3 | 1510/180 | 52/55 | 60/60 | 23.58 | 60/60 |
| 608E5 | 1510/180 | 48/55 | 48/55 | 18.59 | 60/100 |
| 608E6 | 1510/180 | 42/42 | 40/42 | 19.16 | 60/100 |
| 608E7 | 1510/180 | 45/40 | 45/50 | 22.80 | 45/60 |
| 608E8 | 1510/180 | 52/50 | 60/42 | 18.62 | 45/60 |
| 608E9 | 2750/180 | 48/52 | 60/68 | 18.90 | 60/60 |
| 608E10 | 1510/180 | 45/45 | 50/42 | 22.66 | 60/60 |
| 608A3 | 1510/180 | 38/48 | 40/38 | 15.92 | 60/60 |
| 608A4 | 1510/180 | 40/35 | 45/38 | 16.27 | 60/60 |
| 608F | 1510/180 + 1510/180 | 58/48 | 62/52 | 24.55 | 60/60 |
| 608G | 1538/120 + 1510/180 | 42/55 | 45/55 | 19.63 | 45/60 |

E = Alloy B grade starting substrate in SPGN-422 style
A = Alloy B grade starting substrate in TPGN-322 style
F & G = Alloy A grade starting substrate in SPGN-422 style
*first number is from near the center of the rake face, second number is from near a cutting edge An optional, but preferred, buffing of the flank surface of the present invention is achieved by use of a rotating brush whose bristles are impregnated with diamond grit (e.g., 400 mesh grit). Suitable brushes may be purchased from Osborn Manufacturing/ Jason, Inc., of Cleveland, Ohio.

Figure 12:
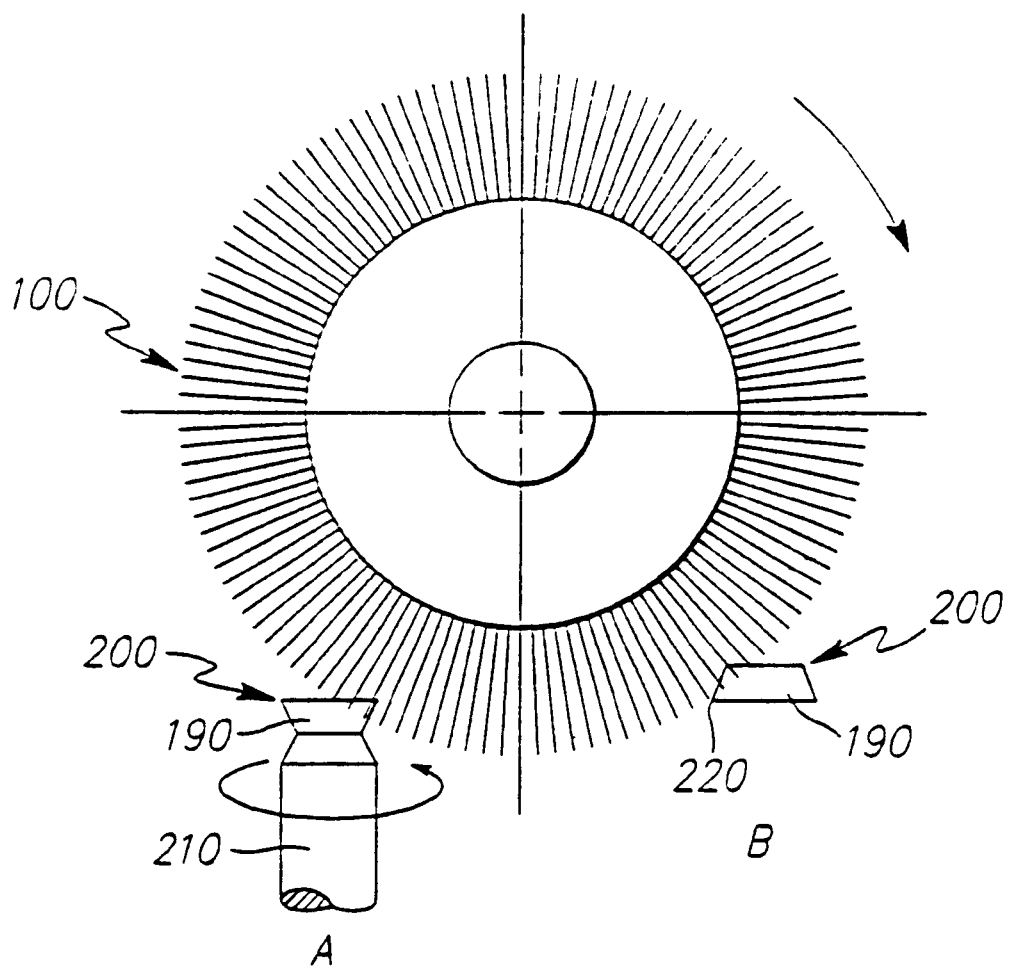
FIG. 12 illustrates an optional buffing step using a rotating brush impregnated with diamond grit.

Turning now to FIG. 12, if buffing is desired, the brush bristles 100 impinge on the flank surfaces 190 of the cutting tool 200. The tool 200 may or may not rotate while in contact with the brush bristles. As shown in FIG. 12, this may be accomplished by mounting the cutting insert 200 on a rotating pedestal 210 such that the insert will rotate about an axis which is perpendicular to the axis of rotation of the brush bristles 100 and allow the bristles 100 to sweep up and over each flank surface 190 (position A). Alternatively, (not shown) each insert flank side or corner may be buffed sequentially by maintaining the orientation of the insert constant (non-rotating) while being buffed, and then, when buffing is complete, indexing the insert to the next corner to be buffed.

In another alternative (shown at position B of FIG. 12), the insert 200 may be inserted, upside down, into the lower righthand quadrant of the clockwise rotating brush. In this manner, the flank surfaces 190 of the insert may be buffed without producing a rounding of the coated cutting edge 220.

As an example, several diamond coated inserts were buffed for 15 minutes using an 8 inch diameter brush impregnated with 400 mesh diamond grit rotating at a speed of 1000 rpm. The surface roughness parameters of the diamond coating were measured with a Sheffield Proficorder Spectre instrument in the as-deposited and the buffed conditions. Roughness data are listed below in Table III and show that the flank surface roughness parameters for the coatings are significantly lowered by the buffing operation. Whereas, $R_a$ measures average roughness, $R_{tm}$ measures peak to valley maximums, and the latter is reduced more significantly by buffing.

TABLE III

EFFECT OF BUFFING ON SURFACE ROUGHNESS PARAMETERS OF DIAMOND-COATED INSERTS

| INSERT CODE | SURFACE CONDITION | SURFACE ROUGHNESS PARAMETERS | |
|---|---|---|---|
| | | $R_a$ MICROINCHES | $R_{tm}$ MICROINCHES |
| A | As-Deposited | 51 | 341 |
| | Buffed | 39 | 268 |
| B | As-Deposited | 91 | 641 |
| | Buffed | 58 | 333 |
| C | As-Deposited | 40 | 277 |
| | Buffed | 35 | 227 |
| D | As-Deposited | 88 | 547 |
| | Buffed | 59 | 330 |
| E | As-Deposited | 44 | 300 |
| | Buffed | 35 | 223 |

Attempts to use brushes impregnated with silicon carbide particles were unsuccessful. Roughness parameters were unchanged after buffing. The disclosed diamond buffing process may be accomplished in shorter times by using more aggressive conditions, such as coarser PCD particles in the bristles, higher rotational speeds, etc.

Beneficial effects of the buffing operation on metalcutting performance is further demonstrated by the following experiments. One corner on each of three SPGN-422 style diamond coated inserts was buffed as described above (the inserts were not rotated during the buffing operation). The diamond coating on the remaining corners was left intact in the as-deposited condition. For comparison, a conventional PCD tool was used in the same metalcutting test. Metalcutting conditions in this turning test were as follows: workpiece material A390 aluminum (about 18% silicon), speed 2500 surface feet per minute, feed 0.005 inches per revolution, depth of cut 0.025 inches. The tools were used in sequence to make two-minute cuts until each tool failed, i.e., a wear land of 0.010 inch developed or the diamond coating was worn through to the substrate. After each two-minute cut, the workpiece surface roughness was measured with a portable profilometer. (A Federal Products Corp. Pocket Surf® model EAS-2632, which uses a diamond stylus to trace the microroughness of the surface.) The results are summarized in Table IV and list the range of workpiece roughnesses measured during the test until tool failure. Workpiece surface finishes provided by the buffed, diamond-coated tools are clearly superior and approximate the finish provided by the PCD tool. These diamond coated tools are suitable for finish-machining operations where surface roughnesses generally less than 80 microinches are required. However, as noted in Table IV, Tool Material C, buffing can be controlled to produce workpiece surface roughnesses of less than 50 microinches, if required, the same as produced by the PCD tool.

TABLE IV

EFFECT OF BUFFING ON WORKPIECE SURFACE FINISHES PROVIDED BY DIAMOND-COATED TOOLS

| TOOL MATERIAL | SURFACE CONDITION | RANGE OF WORKPIECE ROUGHNESS, $R_a$ MICROINCHES |
|---|---|---|
| PCD | Polished | 30 → 44 |
| A | As-Deposited | 51 → 108 |
|   | Buffed | 44 → 75 |
| B | As-Deposited | 70 → 179 |
|   | Buffed | 38 → 73 |
| C | As-Deposited | 55 → 83 |
|   | Buffed | 35 → 40 |

Table IV illustrates that the range of workpiece roughness before and after buffing was reduced by 7–106 $R_a$.

In another experiment, an as-deposited, diamond coated tool at failure (the coating was just worn through to the substrate after 46 minutes of total cutting time, with a wear zone measuring 0.0163 inches) produced workpiece roughnesses ($R_a$) ranging between 184 and 221 microinches. The wear zone on this tool was subjected to the buffing operation described above. After this treatment, the tool produced workpiece surface finishes ($R_a$) ranging between 60 and 67 microinches. Again, the buffing operation was beneficial to tool performance.

The inventors have found that to impart a smooth surface finish with a 400 mesh brush, the buffing time may be of the order of only a few minutes. If a coarser finish is acceptable (e.g., 120 mesh), buffing time may be reduced. Buffing may also be done in two or more steps, a first, fast, stage with a coarse (e.g., 120 mesh) brush to remove the most significant asperities, and then a second, slow, stage to provide the final desired degree of surface smoothness to the diamond coated surfaces, with fine brush (e.g, 400 mesh).

While the invention has been described in detail with respect to the most preferred embodiment, i.e., diamond coated indexable cutting inserts for use in metalcutting applications, such as turning and milling, it is not limited to only indexable cutting inserts for metalcutting.

The present invention may be applied to round tools (such as drills and end mills) and other cutting tools, which may be non-indexable. Cutting tools in accordance with the present invention may also be used to machine other materials in addition to aluminum and its alloys, such as copper, zinc and brass alloys, wood, particle board, nylons, acrylics, phenolic resin materials, plastics, composites, green ceramics and cermets, bone and teeth.

The present invention may also be used in wear parts for such applications as TAB bonders for electronic applications, and dies and punches.

The present invention may also be applied to the tungsten carbide-cobalt cemented carbide tips used in mining and construction tools, and earth and rock drilling tools While the best mode for carrying out the invention has been described in detail, those familiar with the art to which this invention relates will recognize various alternative designs and embodiments for practicing the invention as defined by the following claims.

What is claimed is:

1. A diamond coated cutting tool for chip forming machining of materials comprising:
 a tungsten carbide based cemented carbide substrate having tungsten carbide grains bonded together by a metallic binder selected from the group consisting of cobalt and cobalt alloys;
 wherein said substrate has a substrate surface with relatively large tungsten carbide grains thereat, as compared to said tungsten carbide grains in the interior regions of the substrate, to provide an irregular surface on said substrate;
 a diamond coating deposited upon, and having a strong adherence to, said irregular substrate surface;
 wherein said diamond coating adheres to the irregular substrate surface with an average adhesion strength of greater than 45 kilograms in Rockwell A indentation tests;
 wherein said substrate has a flank surface and a rake surface and a cutting edge formed at the juncture of said flank and rake surfaces;
 wherein said diamond coating is adherently bonded to said rake surface and said flank surface;
 wherein said tungsten carbide based cemented carbide having a composition consisting essentially of tungsten, carbon, cobalt and less than 1 w/o total of Ti, Hf, Zr, Ta, Nb, V, Mo and Cr, and wherein the Ta content is less than or equal to 0.4 w/o, the Ti content is less than or equal to 0.1 w/o and the Nb content is less than or equal to 0.1 w/o; and
 wherein said substrate is characterized by an absence of interconnected porosity in the substrate region adjacent to said irregular substrate surface.

2. The diamond coated cutting tool according to claim 1 wherein cobalt forms about 0.5 to about 7 w/o of said tungsten carbide based cemented carbide.

3. The diamond coated cutting tool according to claim 1 wherein said average adhesion strength of the diamond coating to said substrate surface is at least 60 kg.

4. The diamond coated cutting tool according to claim 1 wherein said average adhesion strength of the diamond coating to said substrate surface is at least 80 kg.

5. The diamond coated cutting tool according to claim 1 wherein the diamond coating adherently bonded to said rake surface has a surface roughness, $R_a$, of greater than 35 microinches, and the diamond coating adherently bonded to said flank surface has a surface which has been smoothed.

6. The diamond coated cutting tool according to claim 1 wherein said diamond coating bonded to said rake surface has an average thickness of about 5 to about 100 $\mu$m.

7. The diamond coated cutting tool according to claim 6 wherein said thickness is about 22 to about 50 $\mu$m.

8. A diamond coated tool comprising:
 a tungsten carbide based cemented carbide substrate having tungsten carbide grains bonded together by a metallic binder selected from the group consisting of cobalt and cobalt alloys;
 wherein said substrate has a substrate surface with relatively large tungsten carbide grains thereat, as compared to said tungsten carbide grains in the interior regions of the substrate, to provide an irregular surface on said substrate;

a diamond coating deposited upon, and having a strong adherence to, said irregular substrate surface;

wherein said diamond coating adheres to the irregular substrate surface with an average adhesion strength of greater than 45 kilograms in Rockwell A indentation tests;

and wherein said tungsten carbide based cemented carbide having a composition consisting essentially of tungsten, carbon, cobalt, and less than 1 w/o total of Ti, Hf, Zr, Ta, Nb, V, Mo and Cr and wherein the Ta content is less than or equal to 0.4 w/o, the Ti content is less than or equal to 0.1 w/o and the Nb content is less than or equal to 0.1 w/o;

and wherein said substrate is characterized by an absence of interconnected porosity in the substrate region adjacent to said irregular substrate surface.

9. The diamond coated tool according to claim 8 wherein cobalt forms about 0.5 to about 7 w/o of said tungsten carbide based cemented carbide.

10. The diamond coated tool according to claim 8 wherein said average adhesion strength of the diamond coating to said substrate surface is at least 60 kg.

11. The diamond coated tool according to claim 8 wherein said average adhesion strength of the diamond coating to said substrate surface is at least 80 kg.

12. The diamond coated tool according to claim 8 wherein said diamond coating has an average thickness of about 5 to about 100 $\mu$m.

13. The diamond coated tool according to claim 12 wherein said thickness is about 22 to about 50 $\mu$m.

14. A diamond coated cutting tool for chip forming machining of materials comprising:

a cemented tungsten carbide substrate having tungsten carbide grains bonded together by a metallic binder;

wherein said cemented tungsten carbide substrate has a substrate surface with relatively large tungsten carbide grains thereat, thereby providing an irregular surface on said substrate having a surface roughness of at least 25 microinches $R_a$;

a diamond coating deposited upon, and having a strong adherence to, said irregular substrate surface;

wherein said relatively large tungsten carbide grains include grains having a size of at least 10 $\mu$m;

wherein said substrate has a flank surface and a rake surface and a cutting edge formed at the juncture of said flank and rake surfaces;

wherein said diamond coating is adherently bonded to said rake surface and said flank surface;

wherein said cemented tungsten carbide having a composition consisting essentially of tungsten, carbon and cobalt and less than 0.6 w/o total of Ti, Hf, Zr, Ta, Nb, V, Mo and Cr;

and wherein the Ta content is less than or equal to 0.4 w/o, the Ti content is less than or equal to 0.1 w/o and the Nb content is less than or equal to 0.1 w/o.

15. The diamond coated cutting tool according to claim 14 wherein said surface roughness is at least 30 microinches $R_a$.

16. The diamond coated cutting tool according to claim 14 wherein said surface roughness is at least 40 microinches $R_a$.

* * * * *